United States Patent [19]

Schilling

[11] Patent Number: 5,655,038
[45] Date of Patent: Aug. 5, 1997

[54] CASCADING OPTICAL SPACE SWITCH

[75] Inventor: Michael Schilling, Stuttgart, Germany

[73] Assignee: Alcatel N.V., Netherlands

[21] Appl. No.: 474,686

[22] Filed: Jun. 7, 1995

Related U.S. Application Data

[62] Division of Ser. No. 198,830, Feb. 18, 1994.

[30] Foreign Application Priority Data

Feb. 18, 1993 [DE] Germany .................. 43 04 993 1

[51] Int. Cl.$^6$ ..................................................... G02B 6/35
[52] U.S. Cl. ................... 385/16; 385/45; 385/131
[58] Field of Search ................... 385/14–17, 24, 385/45, 46, 129–131

[56] References Cited

U.S. PATENT DOCUMENTS

| | | | |
|---|---|---|---|
| 5,127,081 | 6/1992 | Koren et al. | 385/130 |
| 5,134,671 | 7/1992 | Koren et al. | 385/14 |
| 5,334,551 | 8/1994 | Komatsu | 437/105 |
| 5,358,896 | 10/1994 | Komatsu et al. | 437/89 |

OTHER PUBLICATIONS

Patent Abstracts of Japan vol. 17, No. 313 (E–1381) Jun. 15, 1993 and Japanese Patent JP–5029602 (Hitachi Ltd) Feb. 5, 1993.

"New Photonic Device Integration by Selective–Area MOVPE and its Application to Optical Modulator/Laser Integration".

M. Aoki et al, *Microwave and Optical Technology Letters*, vol. 7, No. 3, Feb. 20, 1994, pp. 132–139.

"Switch Arrays for Photonic Switching: Status Review and Prospects" L. Thylen et al, *Globecom '90*, Dec. 1990, San Diego, pp. 1296–1300 (IEEE 1990).

"Monolithically Integrated 2×2 In GaASP/InP Laser Amplifier Gate Switch Arrays", M. Janson et al, Ericsson Telecom AB Publication, Stockholm, pp. 1–3 and 31. (No Date).

"Novel Structure MQW Electroabsorption Modulator/DFB–Laser . . . Fabricated by Selective Area MOCVD Growth", M. Aoki et al, *Electronics Letters*, Nov. 7, 1991, vol. 27, No. 23, pp. 2138–2140.

*Primary Examiner*—John D. Lee
*Attorney, Agent, or Firm*—Ware, Fressola, Van Der Sluys & Adolphson

[57] ABSTRACT

A method for producing a cascaded optical space switch and a cascaded optical space switch manufactured with this method are shown being made of many optical branches produced on a single substrate. Here a method is used for growing active, i.e., controllable light amplifying or light absorbing waveguide areas, which can produce locally restrictable different layer thicknesses and/or material compositions of the grown active layers, during the same operation. The number and location of active (1, 3) and passive (2, 4) waveguide areas can be determined by the configuration of areas (M), e.g., masked with $SiO_2$, prior to the actual growth.

2 Claims, 6 Drawing Sheets

CASCADING OPTICAL SPACE SWITCH

This is a divisional of copending application Ser. No. 08/198,830 filed on Feb. 18, 1994 pending June, 1996.

TECHNICAL FIELD

The invention relates to an optical space switch and, more particularly, to a cascaded optical space switch with aligned waveguides and a method for manufacture thereof.

BACKGROUND OF THE INVENTION

A highly integrated optical space switch is known, for example from an essay by L. Thylen and P. Granestrand, which was made public at the 1990 Globecom 90 in San Diego, (USA), and which is also available as a conference paper. As shown in FIGS. 4 and 8 of this essay, this space switch consists of a very large number of optical branches. Each branch contains monolithically integrated, optically active and passive areas, whose construction e.g. can be seen in FIG. 7. Optically active areas in both arms of each branch serve to control a portion of the light passing through the respective arm.

The manufacture of the optically active and passive areas of the above named optical branches on a substrate is described in detail in a publication by Ericsson Telecom AB, Stockholm, Sweden under the title "Monolithically Integrated 2×2 In Ga As P/In P Laser Amplifier Gate Switch Arrays". It comprises a number of process steps, in which layers are grown or selectively eliminated. The different deposition and etching methods of the manufacture require the substrate to be treated in different containers, and therefore it has to be repeatedly repositioned and readjusted.

DISCLOSURE OF INVENTION

The invention has the task of providing a method for manufacturing a cascading optical space switch, in which the construction of both the active and passive waveguide areas in each layer takes place in a single layering step. Another task of the invention is to provide an optical space switch manufactured in accordance with this method.

According to the present invention, a cascaded optical space switch is made with active and passive waveguide areas grown during a single layering process, utilizing locally-limitable or locally-restrictable effects, which influence the speed of the layer growth.

An effect that influences the speed of the layer growth, which can be restricted or limited to determined areas of a substrate, has already become known in connection with the coupling of a Distributed Feedback (DFB)-laser to an electro-absorption modulator on a substrate (see e.g. M. Aoki et al., Electronics Letters, Nov. 7, 1991 issue, Vol. 27, No. 23, p. 2138–2140).

The use of such an effect that influences the speed of layer growth, e.g., a previous application of a dielectric mask that determines the desired locality of the effect, makes it possible, according to the present invention, to obtain different layer thicknesses in different areas of a waveguide to be layered, thereby a different attenuating and amplifying behavior for light of different wavelengths. In this way, a suitably configured dielectric mask makes it possible to produce active and passive waveguide areas on a substrate, without having to interrupt the layering process for any intermediate etching or masking steps.

According to the present invention, this can be achieved in that active waveguide areas are designed as narrow channels between masked areas, in which, because of the vicinity of the adjacent masked areas (lateral diffusion), a faster layer growth takes place than on the other areas. The desired speed of layer growth can be adjusted by adjusting the width of the masked areas adjacent to the respective waveguide areas. According further to the present invention, passive areas can stay without dielectric masking, or, according still further to the present invention, can be provided with a mask on both sides, which is narrower, however, than that of the active waveguide areas.

In still further accord with the present invention, an optical space switch comprises active and passive waveguide areas that, in the light propagation direction, are narrow strips formed into branches that are cascaded and interconnected in a continuous semiconductor layer or a continuous semiconductor layer package or series of layers, which has a different layer thickness, or a different combination of materials in the active waveguide areas than in the passive waveguide areas.

Active areas are distinguished from passive areas by different layer thickness or material composition of the semiconductor layers that form the waveguide. In addition, according to the present invention, the width of the waveguide can be varied and can be smaller, e.g. in active waveguide areas, than in passive ones.

In the following, the figures describe in detail the process of the invention and the configuration examples of cascading, optical space switches manufactured according to this method.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 1:
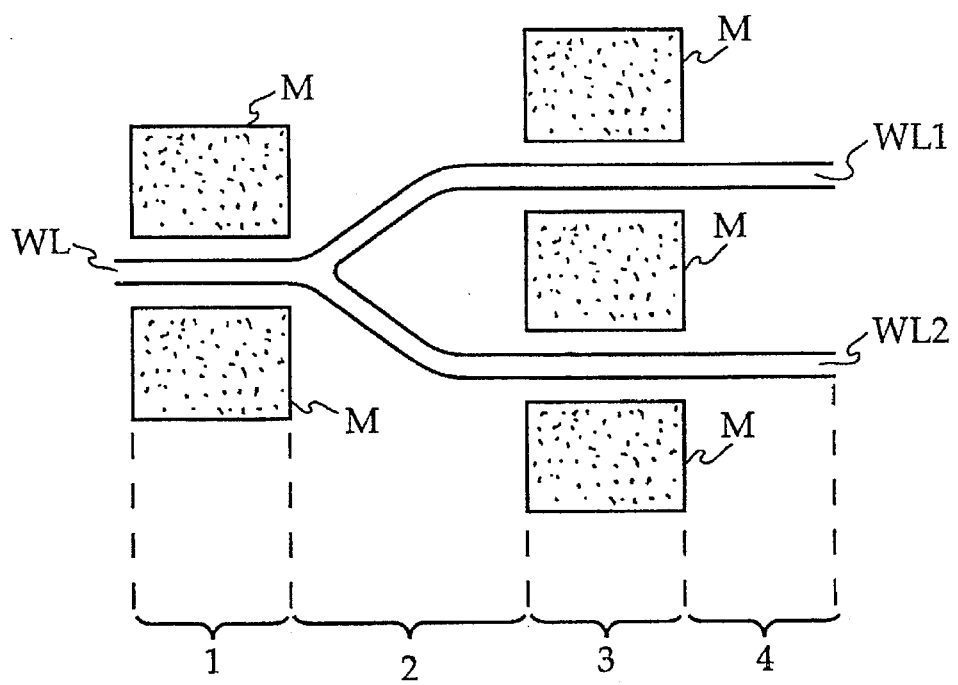
FIG. 1 schematically shows the formation of active and passive waveguide areas in an optical branch, by means of dielectric masking along the active waveguide areas.

FIG. 1 illustrates an optical branch formed by a waveguide WL, which is divided into two partial waveguides WL1 and WL2. Waveguides and partial waveguides have optically active areas (1, 3) in which passing light is amplified or attenuated, e.g. as a function of an applied current, and passive areas (2, 4), in which the incoming light continues without amplification. Light radiating into the waveguides can be selected to continue in one or both partial waveguides. If light from waveguide WL must only enter partial waveguide WL1, this takes place when the active area 3 of partial waveguide WL1 is controlled to be light amplifying, or at least transparent, and at the same time area 3 of partial waveguide WL2 is controlled to be opaque to light, provided that the active area 1 of waveguide WL, which e.g. can be the active area of a partial waveguide of an optical branch upstream, is at least controlled to be transparent.

To form a cascading optical space switch, a selected number of optical branches, formed e.g. according to FIG. 1, are produced on a common substrate, where each partial waveguide of each branch is connected in the known manner to the waveguide or to a partial waveguide of the next or the preceding optical branch. Groups of cascaded branches are arranged in adjacent rows on a substrate and interconnected to form the space switch as shown schematically in FIG. 4 of the above-mentioned article by Thylen et al, for example, at page 1300.

The optical branch shown in FIG. 1 is produced, for example, using masked fields M, according to the invention, which were provided by means of a dielectric coating (e.g., $SiO_2$), prior to growing the layers that form the optical waveguide. These fields are arranged so as to enclose the optical waveguide between them, along its active areas. The dielectric layers of the masked fields on both sides of the waveguides located between the masked fields then cause a diffusion, directed from the masked fields to the waveguide, of the substance required to build the waveguide layers, and thereby an increase in the speed of the layer growth in the respective waveguide area. The material composition may also be affected, since the diffusion rates of individual components of the waveguide layers being grown, are generally different. For example, the portion of elements in the III. group of a III/V semiconductor layer increases. Selecting the surface and shape of the masked fields, and alternatively or additionally varying the width of the waveguide in the different areas (as described below in connection with FIG. 2), allows an adjustment of the relationship of the thickness of the individual layers of the waveguide "mesa", including inserted Multiple Quantum Well (MQW)-layer packages, to the thickness of the respective layers in passive waveguide areas, thereby creating a desired difference in the energy band gaps that are characteristic for the individual layers.

The dielectric layers of the masked fields can be removed after the active layers of the waveguide have been grown, as described in more detail below.

Figure 2:
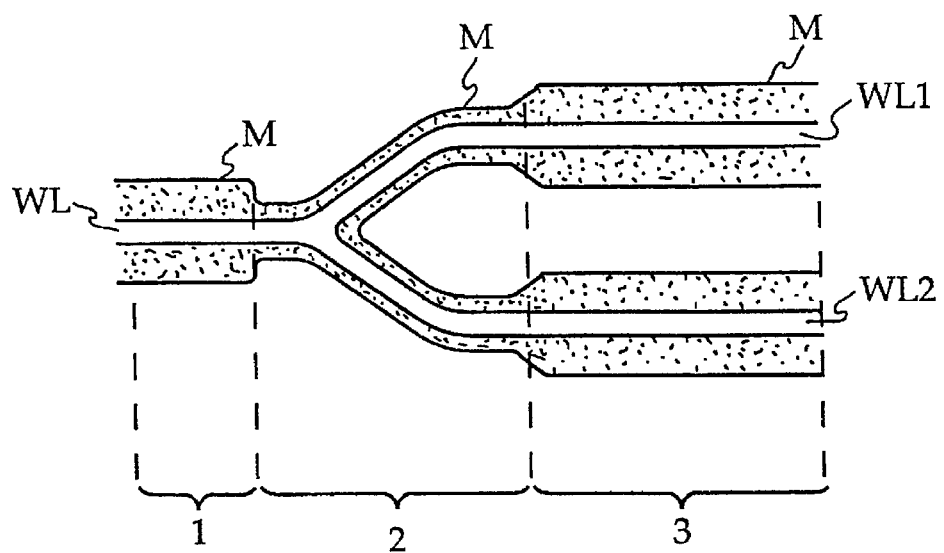
FIG. 2 shows an optical branch with continuous dielectric masking of variable width along active and passive waveguide areas.

FIG. 2 depicts an optical branch, in which all waveguide areas are enclosed by masked areas M. Optically active waveguide areas 1, 3 differ from passive waveguide areas 2 in that the masked surfaces M are wider, which causes an increase in the diffusion rate in the direction of the waveguides. In this case as well, the width of the waveguide can additionally be varied.

Figure 10:
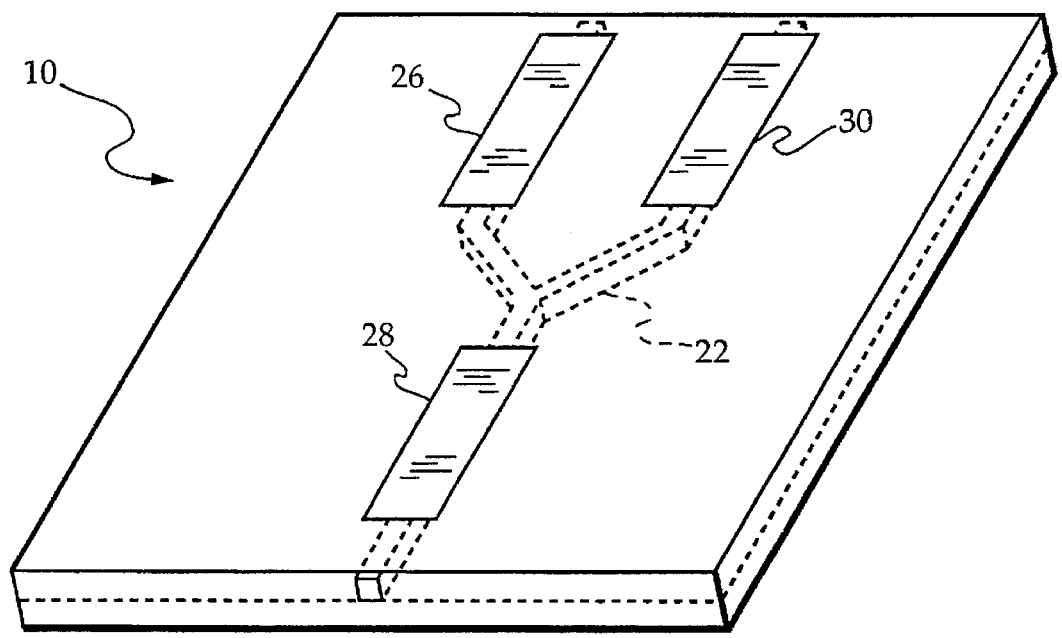
Figure 11:
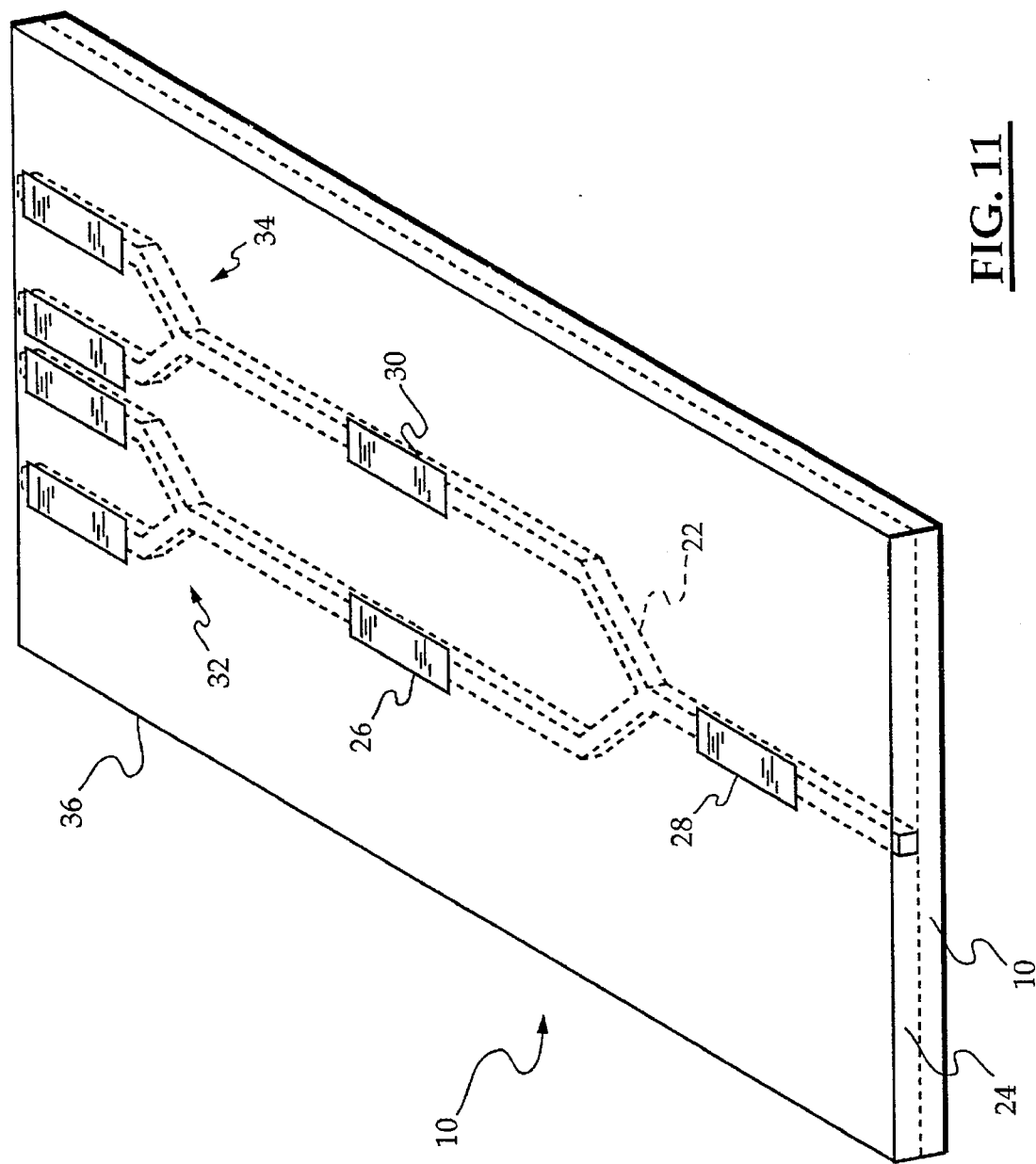
FIG. 11 shows a simple example of rows of cascaded branches with active and passive regions made, according to the present invention, in a single step on the same substrate to form a cascaded optical space switch.

A procedural sequence for manufacturing a branch of a cascaded optical space switch, in accordance with the present invention, will now be described in detail in connection with FIGS. 3–10, and a branch with two following cascaded branches are shown in FIG. 11 on a single substrate as a simplified example of a cascaded optical space switch, according to the invention.

Figure 3:
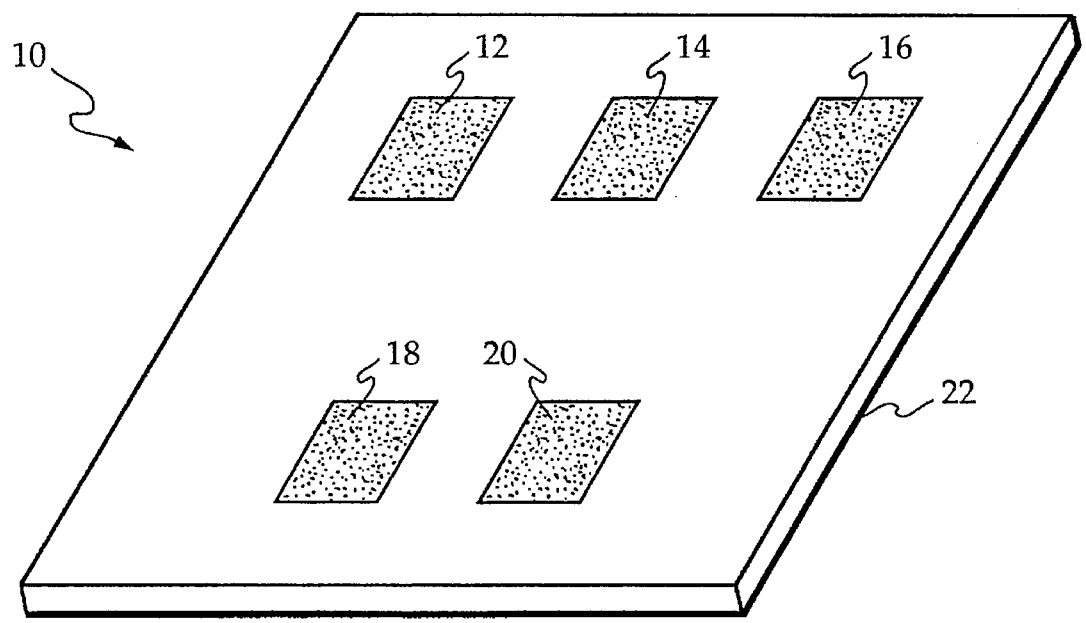
FIGS. 3–10 show a procedural sequence for manufacturing a cascaded optical space switch, according to the present invention.
Figure 4:
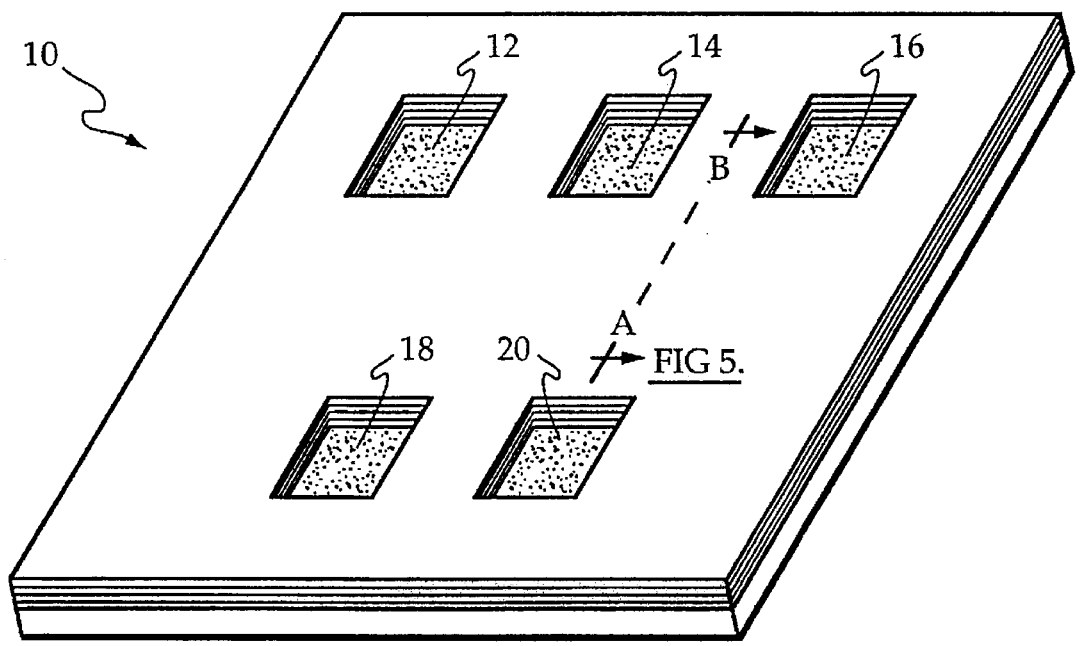

FIG. 3 shows a portion of a much larger substrate, FIG. 3 only illustrating the formation of a single branch of a cascaded optical space switch on a single substrate, with a plurality of such branches cascaded together, such as shown in FIG. 4 of the above-mentioned article by Thylen et al. The portion 10 of the substrate illustrated in FIG. 3 has been patterned with a pattern of $SiO_2$ fields 12, 14, 16, 18, 20. The underlying substrate 22 may comprise a material such as n-type InP. The pattern shown in FIG. 3 is similar to that shown in FIG. 1, with the masks (M) of FIG. 1 being comparable to the $SiO_2$ field pattern 12, 14, 16, 18, 20 of FIG. 3.

FIG. 4 shows the wafer of FIG. 3 after separation of multiple quantum well (MQW) layers by metallo-organic vapor phase epitaxy (MOVPE). It will be observed that no layer-growth occurred on the $SiO_2$ fields, whereas over the other parts of the substrate growth did take place. In fact, according to the present invention, a greater growth rate occurred in the narrow strips between the $SiO_2$ fields illustrated, for example, by a "B" in FIG. 4 in between field 14 and field 16; between fields 12, 14 and between fields 18, 20. The growth rate in a region "A", on the other hand, was not as great, as illustrated in FIG. 5.

Figure 5:
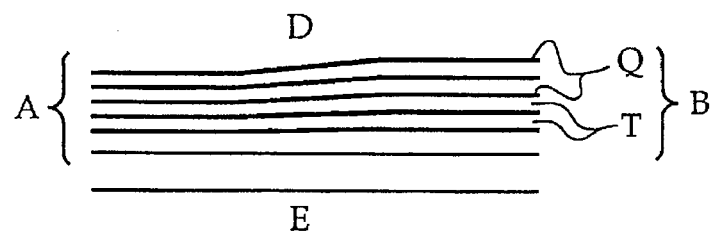

FIG. 5 shows a cross section through the substrate 10 showing layers in the A and B regions of FIG. 4. This clearly shows that in the active region B, there results an active area with thicker layer; it may also have altered mixed crystal composition than will be found in the passive area, with thinner layer thicknesses. On top of the substrate (S), which may be an n-type InP substrate, a series of quantum-well layers (Q) of InGaAsP are separated by interposed barrier layers (T) of InGaAsP, but having a different composition due to the locally-limitable or restrictable effects which influence the layer growth rate and/or the material composition, as described. On top of these Q and T layers, a cover layer (D) of p-type InP may be provided.

Figure 6:
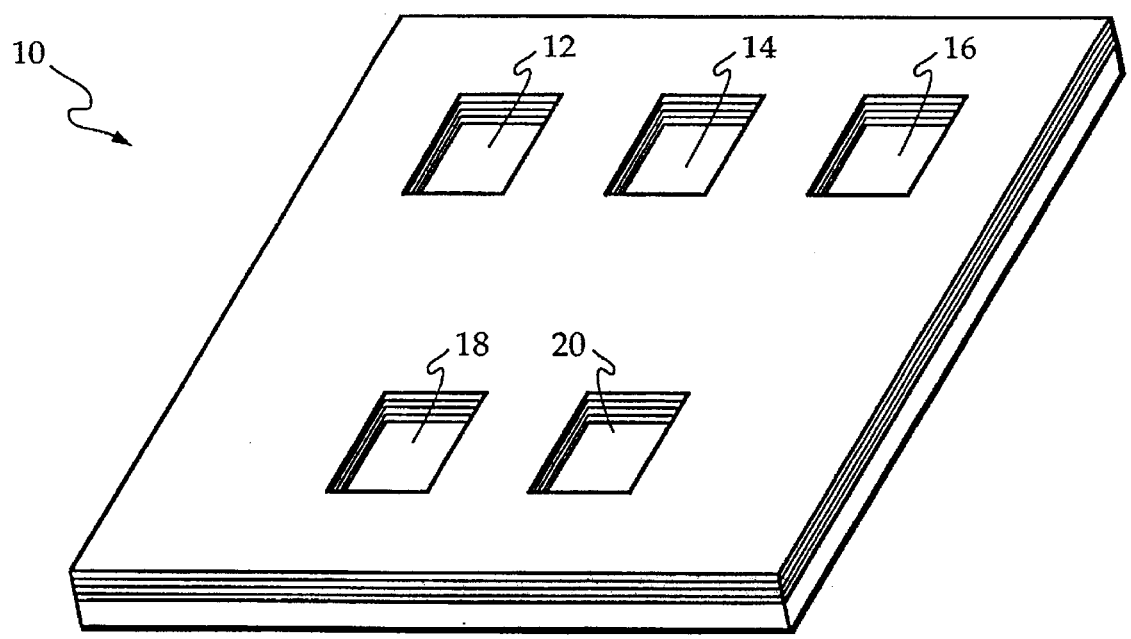

FIG. 6 shows the wafer of FIG. 4 after a next step in the process, i.e., after removal of the $SiO_2$ fields 12, 14, 16, 18, 20.

Figure 7:
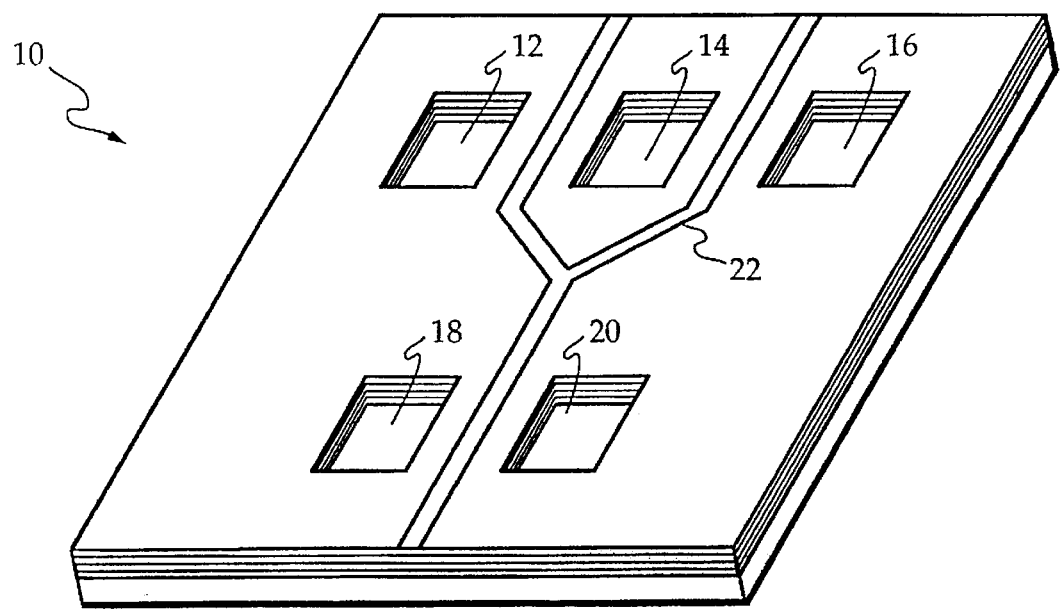
Figure 8:
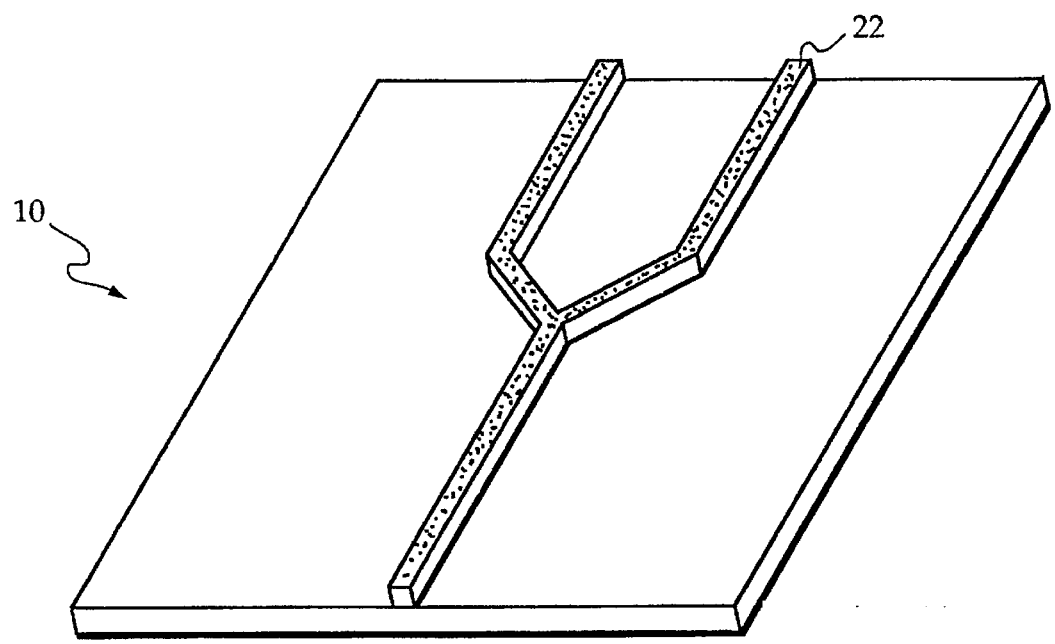

FIG. 7 shows the wafer of FIG. 6 with a photo-lithographically-structured mask 22 applied in a next step for forming a branched waveguide such as shown in FIG. 8, after etching out.

Figure 9:
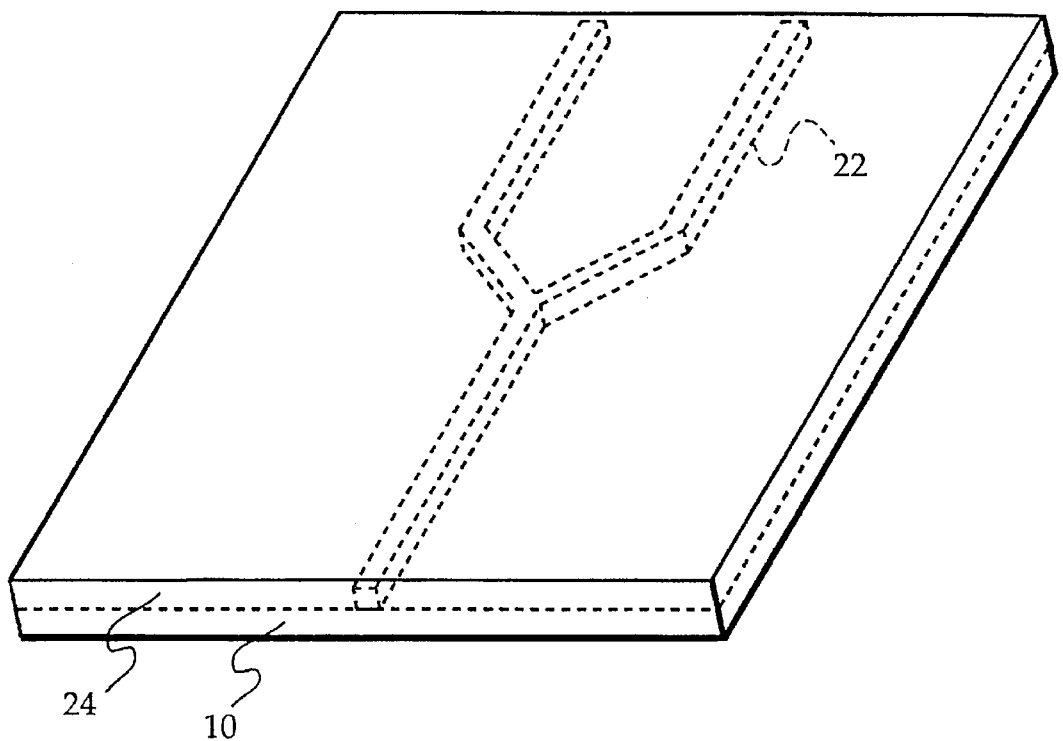

Such a branched waveguide, after etching, can be buried in a next step by epitaxial overgrowth with an InP layer 24, as shown in FIG. 9. Metal electrodes 26, 28, 30 can then be applied in a next step, as shown in FIG. 10, on top of the InP layer in the active areas.

As mentioned previously, the portion 10 of the substrate of FIG. 3 is just a portion of the substrate, and many such branches are intended to be fabricated at the same time in cascade, such as illustrated in a very small example in FIG. 11, which shows a two additional branches 32, 34, such as shown in FIG. 10, cascaded with the branch 22 such that the narrow waveguide strips of FIG. 10 are joined together with similar narrow waveguide strips in other branches, as shown, to form the cascaded optical space switch of the present invention, which has its layers built up with active and passive regions made in the same processing step, without the need for different layering and etching steps, and without the need to have the substrate treated in different containers, and without the need to have it repeatedly repositioned and readjusted.

The two branches 32, 34 are shown adjacent each other on a far edge 36 in such a way as to form a row of branches. Of course, they could be reversed in orientation from that shown. A large number of such rows may be arranged on the surface of the substrate and cascaded with other rows in any desired design. Of course, the branch 22 may also typically be arranged adjacent other branches to form a similar row on a near edge 38, which row may be cascaded with the row on the other edge.

The branches shown and their arrangement are, of course, merely illustrative and may be arranged in any desired orientation or switching structure.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

I claim:

1. Optical space switch with cascaded branches on a substrate having active and passive waveguide areas, wherein in a direction of light propagation the active and passive waveguide areas are grown with one or more continuous semiconductor layers on the substrate during a single layering process using local effects which influence the speed of layer growth, each of the one or more continuous semiconductor layers has a different layer thickness, or a different combination of materials, in the active waveguide areas than in the passive waveguide areas.

2. Optical space switch according to claim 1, wherein a width of the waveguide is narrower in the active waveguide areas than in the passive waveguide areas.

* * * * *